United States Patent
Feng et al.

(10) Patent No.: US 9,985,615 B2
(45) Date of Patent: May 29, 2018

(54) ON-CHIP RANDOMNESS GENERATION

(71) Applicant: INTERNATIONAL BUSINESS MACHINES CORPORATION, Armonk, NY (US)

(72) Inventors: Kai D. Feng, Hopewell Junction, NY (US); Ping-Chuan Wang, Hopewell Junction, NY (US); Zhijian Yang, Stormville, NY (US); Emmanuel Yashchin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/421,465

(22) Filed: Feb. 1, 2017

(65) Prior Publication Data

US 2017/0141771 A1    May 18, 2017

Related U.S. Application Data

(63) Continuation of application No. 13/739,151, filed on Jan. 11, 2013, now abandoned.

(51) Int. Cl.
*H03K 3/84* (2006.01)
*H03K 5/01* (2006.01)
*H03K 3/012* (2006.01)

(52) U.S. Cl.
CPC ............ *H03K 3/84* (2013.01); *H03K 3/012* (2013.01); *H03K 5/01* (2013.01)

(58) Field of Classification Search
CPC . H03K 3/012; H03K 3/84; H03K 5/01; G06F 7/588
See application file for complete search history.

(56) References Cited

U.S. PATENT DOCUMENTS

| | | | |
|---|---|---|---|
| 4,056,788 A | 11/1977 | Brown et al. |
| 4,169,249 A | 9/1979 | Hoffmann et al. |
| 4,810,975 A | 3/1989 | Dias |
| 4,853,884 A | 8/1989 | Brown et al. |
| 4,855,690 A | 8/1989 | Dias |

(Continued)

FOREIGN PATENT DOCUMENTS

| | | |
|---|---|---|
| DE | 112014000289 T5 | 12/2015 |
| EP | 1320026 A1 | 6/2003 |

(Continued)

OTHER PUBLICATIONS

International Search Report/Written Opinion, PCT/US2014/010433; dated May 29, 2014, 10 pages.

(Continued)

*Primary Examiner* — Lincoln Donovan
*Assistant Examiner* — Colleen O Toole
(74) *Attorney, Agent, or Firm* — L. Jeffrey Kelly

(57) ABSTRACT

An on-chip true noise generator including an embedded noise source with a low-voltage, high-noise zener diode(s), and an in-situ close-loop zener diode power control circuit. The present invention proposes the use of heavily doped polysilicon and silicon p-n diode(s) structures to minimize the breakdown voltage, increasing noise level and improving reliability. The present invention also proposes an in-situ close-loop zener diode control circuit to safe-guard the zener diode from catastrophic burn-out.

18 Claims, 8 Drawing Sheets

(56) References Cited

U.S. PATENT DOCUMENTS

| | | |
|---|---|---|
| 5,206,905 A | 4/1993 | Lee et al. |
| 5,331,217 A | 7/1994 | Mellissinos |
| 5,390,189 A | 2/1995 | Tateishi |
| 5,633,816 A | 5/1997 | Wallace |
| 5,680,131 A | 10/1997 | Utz |
| 5,802,073 A | 9/1998 | Platt |
| 5,892,477 A | 4/1999 | Wehling |
| 5,905,453 A | 5/1999 | Kase |
| 5,923,280 A | 7/1999 | Farmer |
| 5,963,104 A | 10/1999 | Buer |
| 6,097,307 A | 8/2000 | Utz |
| 6,469,576 B2 | 10/2002 | Hasegawa |
| 6,480,870 B1 | 11/2002 | Park |
| 6,631,390 B1 | 10/2003 | Epstein |
| 6,671,663 B1 | 12/2003 | Hellums et al. |
| 6,727,765 B1 | 4/2004 | Ess |
| 6,857,003 B2 | 2/2005 | Saito |
| 6,906,401 B2 | 6/2005 | Dunn et al. |
| 7,007,060 B2 | 2/2006 | Miller, Jr. |
| 7,009,544 B2 | 3/2006 | Huang |
| 7,082,539 B1 | 7/2006 | Kitahara et al. |
| 7,113,967 B2 | 9/2006 | Cleve et al. |
| 7,124,157 B2 | 10/2006 | Ikake |
| 7,125,334 B2 | 10/2006 | Yamazaki et al. |
| 7,152,942 B2 | 12/2006 | Walmsley et al. |
| 7,184,555 B2 | 2/2007 | Whaley et al. |
| 7,230,971 B1 | 6/2007 | Beard |
| 7,243,065 B2 | 7/2007 | Stephens et al. |
| 7,292,596 B1 | 11/2007 | Campana et al. |
| 7,327,308 B2 | 2/2008 | Cheng et al. |
| 7,475,102 B2 | 1/2009 | Nagahara |
| 7,523,111 B2 | 4/2009 | Walmsley |
| 7,545,256 B2 | 6/2009 | O'Toole et al. |
| 7,653,123 B1 | 1/2010 | Woodings |
| 7,653,855 B2 | 1/2010 | Yasuda et al. |
| 7,660,944 B2 | 2/2010 | Luo |
| 7,660,998 B2 | 2/2010 | Walmsley |
| 7,672,592 B2 | 3/2010 | Barker et al. |
| 7,702,704 B2 | 4/2010 | Muranaka |
| 7,707,621 B2 | 4/2010 | Walmsley |
| 7,750,305 B2 | 7/2010 | Solt et al. |
| 7,752,247 B2 | 7/2010 | Wilber |
| 7,763,940 B2 | 7/2010 | Mergens et al. |
| 7,793,084 B1 | 9/2010 | Mimar |
| 7,797,361 B2 | 9/2010 | Lazich et al. |
| 7,814,336 B1 | 10/2010 | Nisbet et al. |
| 7,814,446 B1 | 10/2010 | Grant |
| 7,840,921 B1 | 11/2010 | Grant |
| 7,873,812 B1 | 1/2011 | Mimar |
| 7,973,612 B2 * | 7/2011 | Raghunathan ......... H03L 7/099 331/185 |
| 8,738,675 B2 * | 5/2014 | Ergun ............... G06F 7/58 708/250 |
| 2003/0090306 A1 | 5/2003 | Saito |
| 2005/0006567 A1 | 1/2005 | Stewart et al. |
| 2008/0218924 A1 | 9/2008 | Penniston |
| 2010/0146025 A1 | 6/2010 | Ergun |
| 2011/0267724 A1 | 11/2011 | Mallikarjunaswamy |
| 2012/0146565 A1 | 6/2012 | Parenti |
| 2014/0197865 A1 | 7/2014 | Feng et al. |

FOREIGN PATENT DOCUMENTS

| | | |
|---|---|---|
| GB | 2524429 A | 9/2015 |
| KR | 1020040085608 A | 10/2004 |
| WO | 2014110007 A1 | 7/2014 |

OTHER PUBLICATIONS

Holman, et al., "An Integrated Analog/Digital Random Noise Source," IEEE Transactions on Circuits and Systems—I: Fundamental Theory and Applications, vol. 44, No. 6, Jun. 1997, pp. 521-528.

Groza, et al., "Secure Broadcast With One-Time Signatures In Controller Area Networks," 2011 Sixth International Conference on Availability, Reliability and Security, IEEE Computer Society, pp. 371-376.

Stojanovski, et al., Chaos-Based Random Number Generators—Part I: Analysis; IEEE Transactions on Circuits and Systems—I: Fundamental Theory and Applications, vol. 48, No. 3, Mar. 2001, pp. 281-288.

Examination Report under Section 18(3), Application No. GB1511989.4, dated Aug. 27, 2015, 4 pages.

Jia Jiping, "A New Method for Generating Keys," Proceedings of ICSP '96, Oct. 14-18, 1996, p. 1570-1573, 3rd International Conference on Signal Processing Proceedings, vol. II, IEEE Press, Beijing, China.

Petrie et al., "A Noise-Based IC Random Number Generator for Applications in Cryptography," IEEE Transactions On Circuits And Systems I: Fundamental Theory And Applications, May 2000, p. 615-621, vol. 47, No. 5.

Somlo, "Zener-Diode Noise Generators," Electronics Letters, May 29, 1975, p. 290, Published Jul. 10, 1975, vol. 11, No. 14, 1 page.

Yasin, "Air Force, IBM plan to demonstrate secure cloud computing," GCN, Feb. 4, 2010, p. 1-3, Technology, Tools and Tactics for Public Sector IT, 1105 Media Inc., http://gcn.com/Articles/2010/02/04/Air-Force-IBM-Cloud-Computing.aspx?p=1, Accessed on Mar. 2, 2015, 3 pages.

* cited by examiner

ON-CHIP RANDOMNESS GENERATION

BACKGROUND

The present invention relates to random number generation. More specifically, the present invention relates to generating random noise/numbers embedded in a semiconductor chip with a reduced operating voltage.

Good cryptography requires good random numbers. Almost all cryptographic protocols require the generation and use of secret values that must be unknown to attackers. For example, random number generators are required to generate public/private key pairs for asymmetric (public key) algorithms including RSA, DSA, and Diffie-Hellman. Keys for symmetric and hybrid cryptosystems are also generated randomly. RNGs are also used to create challenges, nonces (salts), padding bytes, and blinding values. The one time pad—the only provably-secure encryption system—uses as much key material as cipher text and requires that the keystream be generated from a truly random process.

Generating real random numbers has become increasingly vital to information securities, particularly for recent developments in cloud computing, because of its unpredictable pattern suited for the encryption security application. Thus, random number generators have been widely employed from large stationary servers to small mobile devices. However, traditional pseudo-random numbers generated by digital circuits no longer meet the security requirements due to the increasing availability of powerful deciphering computing systems.

It is well known that a zener diode or an avalanche PN junction is a commonly used as the white noise source in discrete circuits. However, at least two challenges must be overcome for the noise source to be implemented in the integrated circuits. First, the breakdown voltage of a discrete zener is quite high, typically about 6V, which is much higher than the maximum operation voltage of the advanced technologies. Second, when the diode is operated in the avalanche mode close to the breakdown condition, the current-voltage curve is very steep. If the voltage is too low, the diode may not enter the avalanche mode. If the voltage is too high, the current becomes very large and the diode could be damaged by breakdown. Although the immediate solution for the discrete zener diode is to enlarge the diode size, it is not feasible in integrated circuits because of the parasitic capacitance concern that will deteriorate circuit performance, cost considerations and reliability concerns.

In prior random noise/number generators, the noise sources are always presented as a block and require external physical noise sources for the circuits. Some noise generators rely on the noise based on physical phenomenon like the thermal noise of resistors.

It is known in the art that a zener diode is a very strong noise source due to the physical nature of its avalanche phenomenon close to the breakdown condition. However, the zener voltage of conventional zener diodes used for random noise generation is about 6V, which exceeds the operation voltage of typical advanced CMOS technologies, for example 1V-2.5V. As zener diodes are p-n junction diodes, increasing p-n junction doping level and abruptness will theoretically result in lower breakdown voltages.

Differential noise pair circuits have been explored previously to cancel out the common cause of variability, such as temperature fluctuation, in order to achieve true white noise sources. Previously used circuits employ one differential circuit for two noise generating blocks. However, they use amplifier circuits in each noise generating block which will distort the noise spectrum because of the limited bandwidth of the amplifiers. Other circuits employ differential circuits on two sources of random noise and then amplify the resulting noise to the level required by voltage comparator. The main drawback of this approach is that the required gain level of amplification is very high (several orders of magnitude) and the resulting reduction in the bandwidth of the amplifier (note that because the product of the gain and the bandwidth of an amplifier is about constant). Such reduction in amplifier bandwidth increases the signal correlation and reduces the randomness of the generated noise.

SUMMARY

The present invention provides solutions including a Noise Generating Unit (NGU) comprising a highly doped diode to make a low breakdown voltage surface zener diode and an automatic avalanche current control loop, allowing the entire noise source to be embedded into and compatible with other random noise generator circuits. Further, the present invention will utilize the high noise signal of the abovementioned NGU and construct a Stochastic Noise Amplification apparatus comprising multi-NGU structures that is capable of not only neutralizing effects of common causes of variability (such as local thermal effects), but also of naturally amplifying the magnitude of noise to the level where only minimal gain of amplification is needed, if at all. The Stochastic Noise Amplification apparatus allows the output noise level to be amplified by a factor of 1.414 (square root of 2) when two identical NGU's pass through one differential amplifier. If the noise level is amplified by multiple stages, n, the noise level can be increased by the factor of $1.414^n$, while keeping the same total magnitude of amplification.

The present invention provides a true noise generator including a low breakdown voltage surface zener diode, an automatic avalanche current control loop, an algorithm for automatic voltage regulation, and an apparatus to increase noise level with multiple differential amplification stages. The present invention concerns designing an on-chip true noise generator including an embedded noise source with a low-voltage, high-noise zener diode(s), and an in-situ close-loop zener diode power control circuit for optimization between performance and reliability. In order to reduce operating voltage so that it can be used in the ASIC library, the present invention proposes the use of heavily doped polysilicon and silicon p-n diode(s) structures for a surface zener diode that minimizes the breakdown voltage, increase noise level and improves reliability. The present invention also proposes an in-situ close-loop zener diode control circuit to optimize performance while also safe-guard the zener diode from catastrophic burn-out. The present invention further proposes an algorithm or methodology to teach the procedure for optimizing between the noise generating performance and the reliability of the zener diode. Furthermore, the present invention also proposes a Stochastic Noise Amplification apparatus to amplify the noise level and at the same time neutralize effects of common causes of variability (such as local thermal effects).

The present invention forms an on-chip physical noise source for random noise generation, which can be integrated and fabricated in any standard CMOS or BiCMOS circuits. Furthermore, the present invention embeds a noise source having control and protection circuits which facilitate stable noise output and long operating lifetime. The present invention also generates white noises directly from one pair of differential embedded noise sources. Moreover, the present invention generates true random noise from multiple parallel pairs of signal noise amplification.

In a first aspect of the invention, there is an on-chip semiconductor structure forming a low breakdown voltage surface zener diode with either single- or multi-finger configuration as the embedded noise source.

In a second aspect of the invention, there is a an automatic avalanche current control loop to regulate the supply voltage for the low breakdown surface zener diode for optimizing between noise generating performance and device reliability.

In a third aspect of the invention, there is a methodology to conduct supply voltage regulation for automatic avalanche current control in order to optimize the performance and reliability of the noise generating source.

In a fourth aspect of the invention, there is a stochastic noise amplification apparatus with paired noise generating source to amplify the noise level and at the same time neutralize the effects of common causes of variability.

BRIEF DESCRIPTION OF THE DRAWINGS

The features and elements of the present invention are set forth with respect to the appended claims and illustrated in the drawings.

DETAILED DESCRIPTION

The present invention provides a true noise generator including a differential zener diode pair and a stochastic noise amplifier. The present invention concerns designing an on-chip true noise generator including an embedded noise source with a low-voltage, high-noise zener diode(s), and an in-situ close-loop zener diode current control circuit. In order to reduce operating voltage so that it can be used in the ASIC library, the present invention proposes the use of heavily doped polysilicon and silicon p-n diode(s) structures to minimize the breakdown voltage, increasing noise level and improving reliability. The present invention also proposes an in-situ close-loop zener diode current control circuit to safe-guard the zener diode from catastrophic burn-out.

The present invention forms an on-chip physical noise source for random noise generation, which can be integrated and fabricated in any standard CMOS or BiCMOS circuits. Furthermore, the present invention embeds a noise source having control and protection circuits which facilitate stable noise output and long operating lifetime. The present invention also generates white noises directly from one pair of differential embedded noise sources. Moreover, the present invention generates true random noise from multiple stage signal noise amplification.

The following describes embodiments of the present invention with reference to the drawings. The embodiments are illustrations of the invention, which can be embodied in various forms. The present invention is not limited to the embodiments described below, rather representative for teaching one skilled in the art how to make and use it. Some aspects of the drawings repeat from one drawing to the next. The aspects retain their same numbering from their first appearance throughout each of the preceding drawings.

Figure 1B:
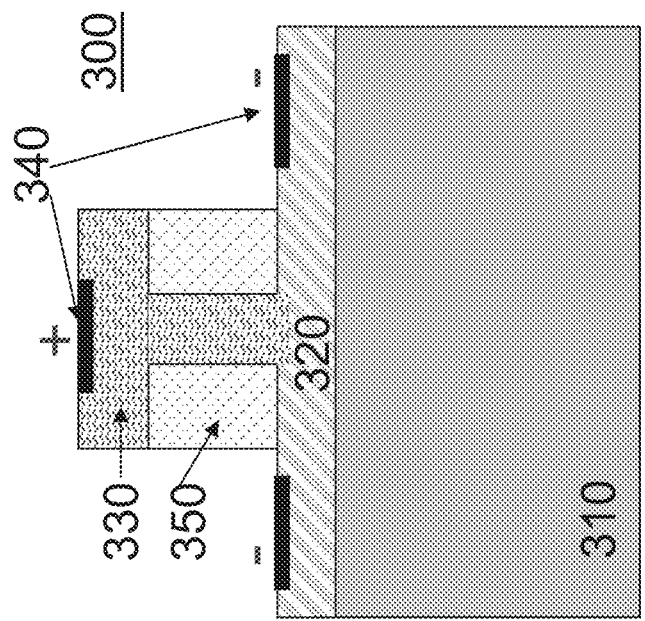
FIG. 1B illustrates a cross section of a heavily doped polysilicon and silicon p-n zener diode.
Figure 1A:
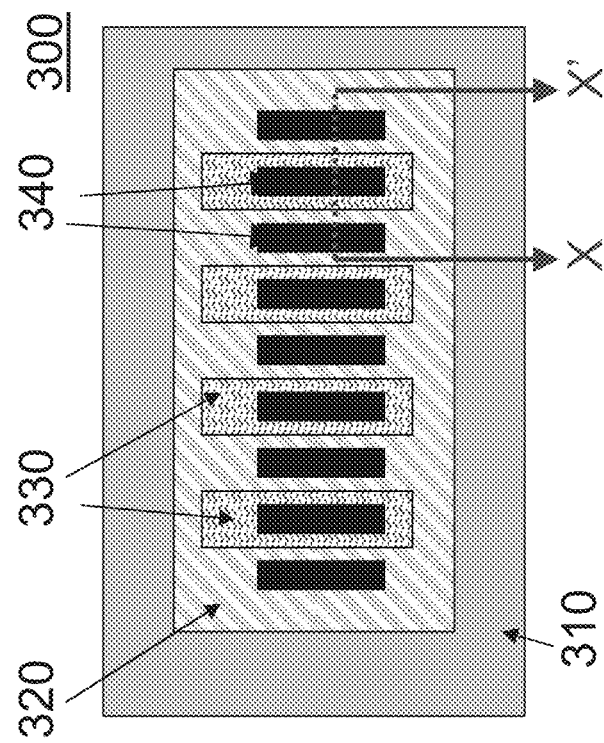
FIG. 1A illustrates top view of a heavily doped polysilicon and silicon p-n zener diode.

FIG. 1A illustrates top view of a heavily doped polysilicon and silicon p-n zener diode 300 fabricated on a substrate 310. Zener diode 300, is formed on a substrate 310 and comprises a heavily doped silicon layer 320 (e.g. heavily P-type doped), with a heavily doped (e.g. heavily N-type doped) polysilicon layer 330 periodically formed on the silicon layer 320. The zener diode 300 is a surface diode, which is well known to be noisier than typical buried zener diode. The low breakdown voltage of the p-n junction is due to the heavily doped polysilicon widely employed in the polysilicon emitter of bipolar transistors in recent BiCMOS technologies. The proposed low breakdown voltage surface zener diode 300 has a PN junction on the primary surface of a P-doped silicon substrate 320, where the diode is formed between a heavily P-doped ($>10^{18}$ cm$^{-3}$) silicon layer 320 on the surface and a heavily N-doped ($>10^{18}$ cm$^{-3}$) polysilicon feature 330 on the surface of the silicon layer 320. The P and N region are both heavily doped in order to lower the breakdown voltage for the application. Both the silicon layer 320 and the heavily N-doped polysilicon (poly) layer 330 have silicide contacts 340.

FIG. 1B illustrates a cross section of a heavily doped polysilicon and silicon p-n zener diode 300. The cross section is from sections X to X' of FIG. 1A. As shown the N-doped polysilicon layer 330 is located above and in contact with the silicon layer 320. Silicon layer 320 is heavily doped with p-type material such as boron (B). N Poly layer 330 is heavily doped with n-type materials such as arsenic (As). A spacer 350 is located around N-doped poly layer 330. The spacer 350 may be a protective silicon oxide or nitride spacer 350 and may be formed to protect the sidewall of the raised polysilicon feature 330 and to further increase noise. Silicide regions (340) (such as Ti silicide, Co silicide, etc.) are formed to provide electrical contacts for anode (+) and cathode (−). Note that each discrete surface zener diode comprises a pair of anode/cathode, and it can also be contemplated that a "multi-finger" structure with multiple discrete diodes formed together to increase current and noise level, as shown in FIG. 1A.

Figure 2:
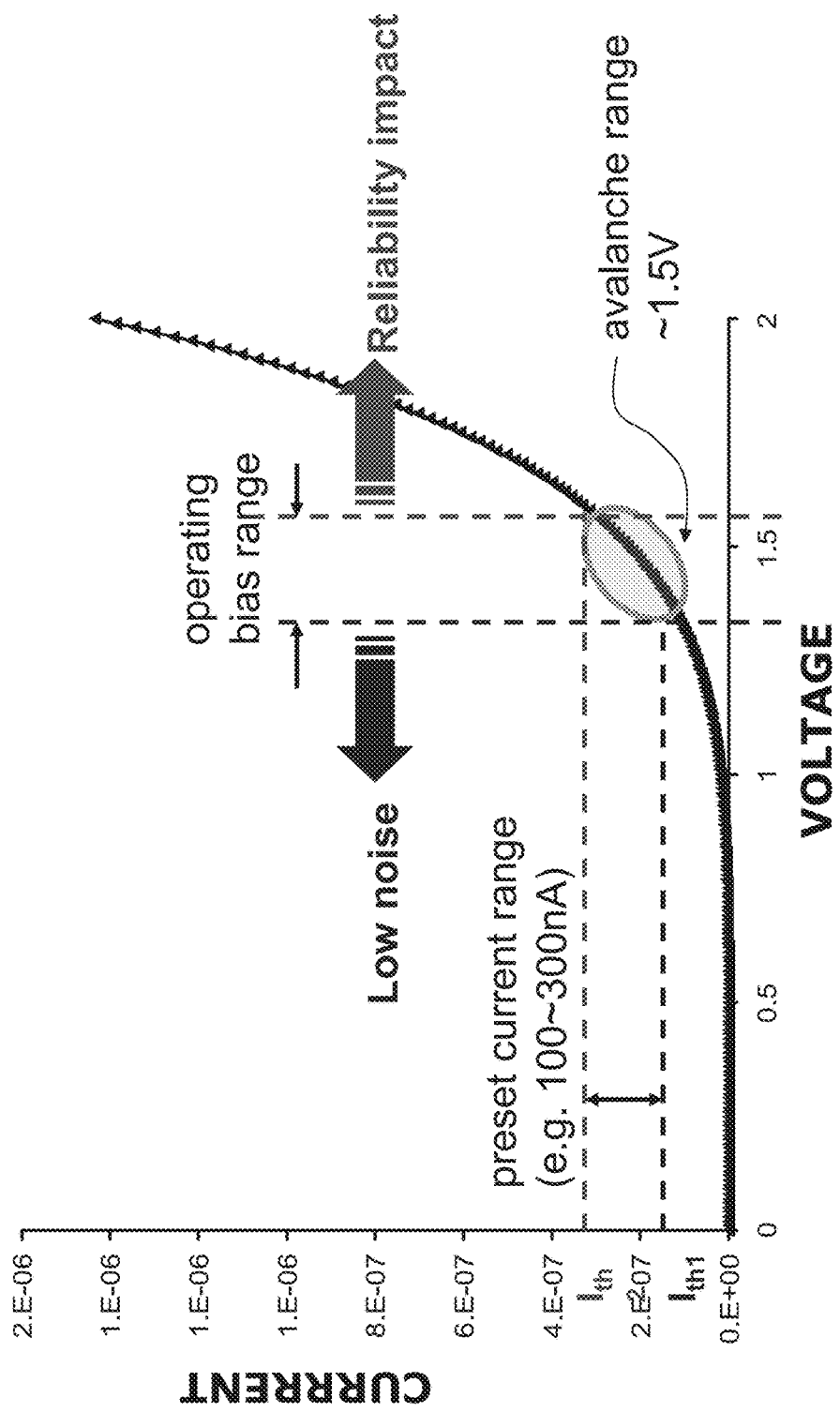
FIG. 2 illustrates the voltage characteristics of a heavily doped polysilicon and silicon p-n zener.

FIG. 2 illustrates the voltage characteristics of a heavily doped polysilicon and silicon p-n zener. The y axis illustrates the current flow through zener diode 300 and the x axis illustrates the voltage across the zener diode 300. As can be seen from the graph the avalanche range of the zener diode 300 is approximately 1.5 volts before reaching the breakdown condition. The inventors have determined that by operating the zener diode 300 in the avalanche range close to breakdown condition, it will produce a noise signal upon the dc voltage across the zener diode 300. The inventors have also determined that by maintaining a current range across the zener diode 300 in the range of 100 to 300 nAmps, the zener diode will stay in the avalanche range. As can be seen the avalanche range is well within the operating voltages of a modern semiconductor.

Figure 3:
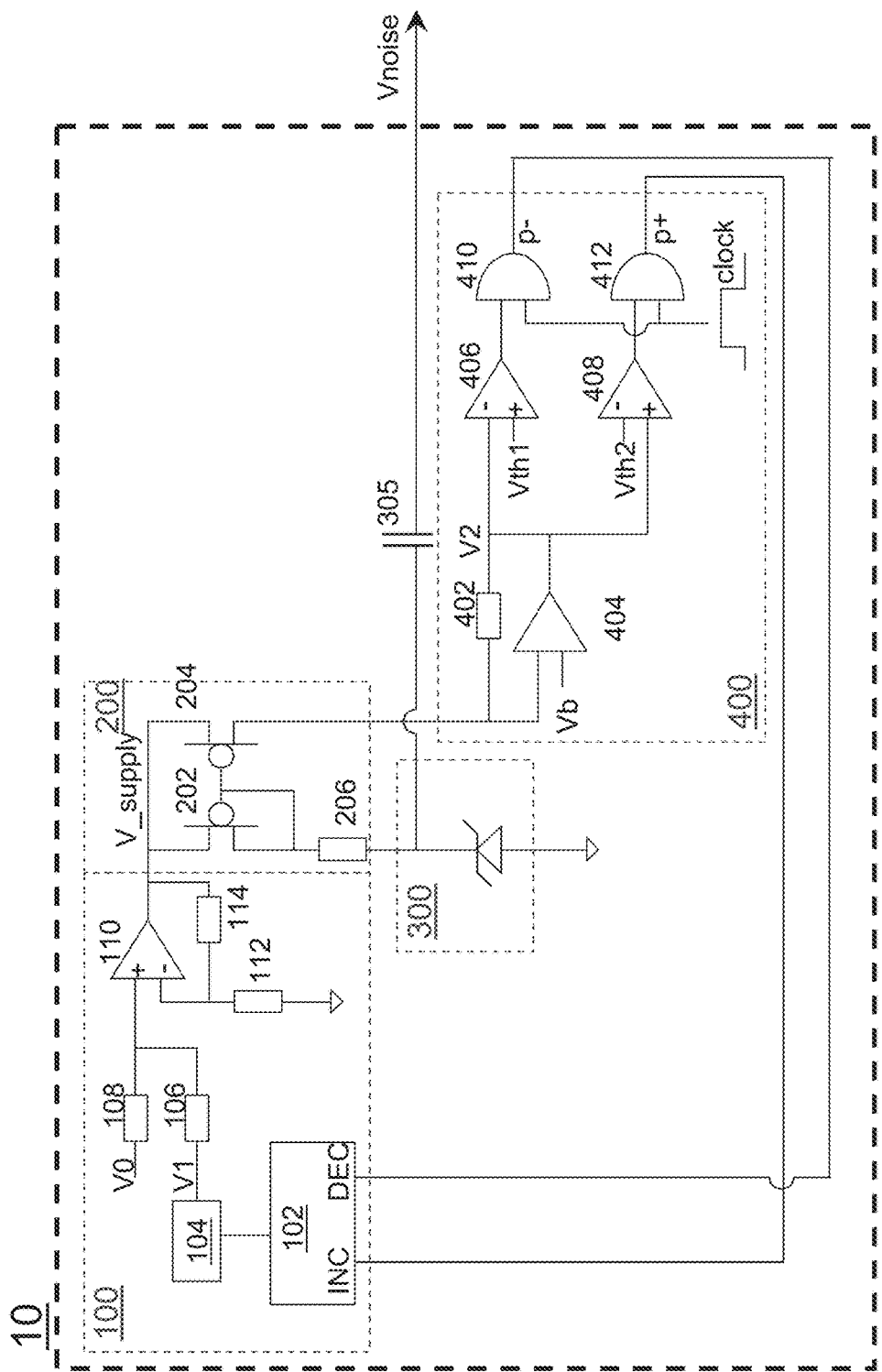
FIG. 3 illustrates a block diagram of a noise generating unit or NGU.

The block diagram shown in FIG. 3 illustrates a Noise Generating Unit 10 (NGU) including an adjustable voltage source 100, a current probe 200, a zener diode 300 and a current monitor 400. The NGU 10 operates to control the voltage across the zener diode 300 and ensures that the zener diode 300 is only biased at the avalanche current range discussed above. When the zener diode 300 is placed in the avalanche region before the breakdown occurs, the zener diode 300 introduces significantly higher noise signal onto the voltage. The close-loop control system avoids the catastrophic failure normally seen in a single voltage controlled noise sources because of possible thermal run-away if the device is controlled by voltage when temperature rises. The voltage at the input to the zener diode is provided to a capacitor $C_1$ which provides the output noise signal Vnoise for NGU 10.

Figure 4:
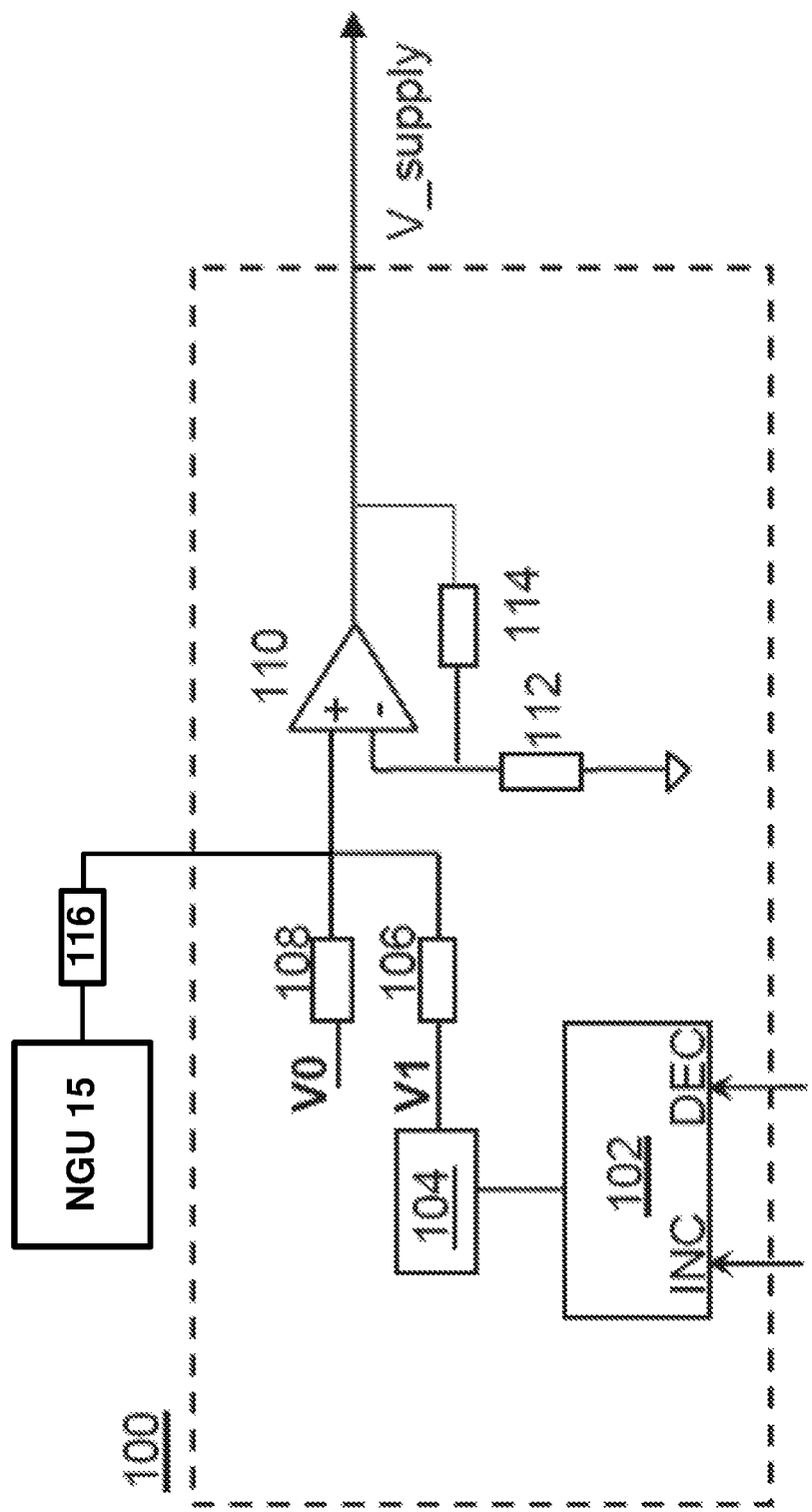
FIG. 4 illustrates a preferred embodiment of an adjustable voltage source according to aspects of the present invention.

FIG. 4 shows a preferred embodiment of the adjustable voltage source 100. Operational amplifier 110 and resistors 106, 108, 112 and 114 form a voltage adder. Resistors 112 and 114 may have the same resistance and resistors 106 and 108 may have the same resistance such that the output voltage is V_supply=$2*(V_0+V_1)$. Wherein $V_0$ is a fixed voltage, which is selected such that $2V_0$ does not cause breakdown in zener diode 300. $V_1$ is an adjustable voltage, which is directly related to the current through zener diode 300. $V_1$ is the output voltage of digital to analog converter (DAC) 104. The input of DAC 104 is the output of counter 102; thus $V_1$ is determined by the content of counter 102. Counter 102 operates in the increment or decrement mode when a rising edge of logic low to logic high is applied to the input of either increase INC or decrease DEC. The content of counter 102 is increased by one when a rising edge of logic high is applied to the input of increase INC. When a rising edge of logic high is applied to the input of decrease DEC, the content of counter 102 is decreased by one. Operational amplifier 110 should have the capability to drive the avalanche current of the zener diode 300. As an avalanche current has quite a steep slope versus the voltage applied on the zener diode 300, V_supply is the sum of $V_0$ and $V_1$ to reach the high adjustment resolution for a given bit of DAC and to avoid the possible oscillation. Setting V_supply depends on the real device. As illustrated the zener diode breaks down at 1.5V with safe operating range from 1.4V to 1.6V. Therefore can set $V_0$ at 0.6V, with $V_1$ having a range of operation from 0.1V to 0.2V range.

In another embodiment as shown in FIG. 4, an additional input to operational amplifier 110 may be an output from a NGU 15 from a different NGU. The NGU 15 is input to operational amplifier 110 through resistor 116. The addition of the input from NGU 15 adds a noise signal to V_supply which will ultimately add to the unpredictability of the noise output of zener diode 300.

Figure 5:
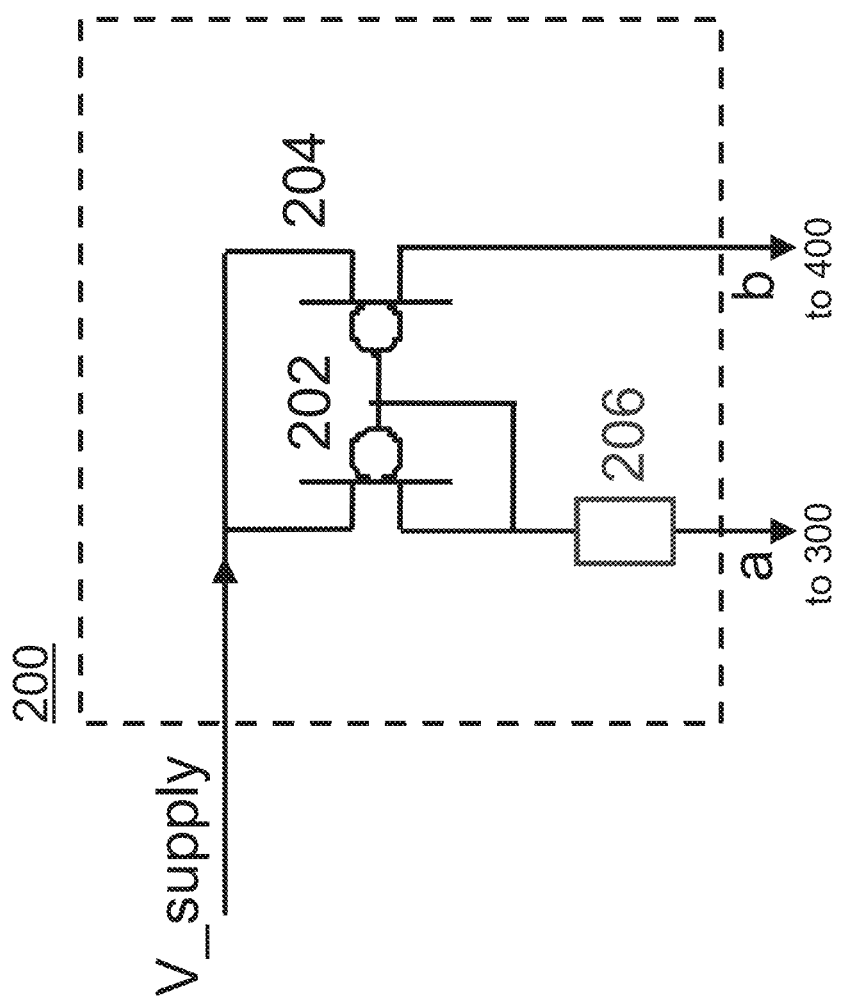
FIG. 5 illustrates the circuit of a current probe according to aspects of the present invention.

The circuit of current probe 200 is shown in FIG. 5. Two p-type metal-oxide-semiconductor field-effect transistors (MOSFETs) 202 and 204 form a current mirror that mirrors the current of zener diode 300 and provides current to current monitor 400. Resistor 206 is the load of the noise generated by zener diode 300. Terminal a is connected to zener diode 300 and terminal b is connected to current monitor 400.

Figure 6:
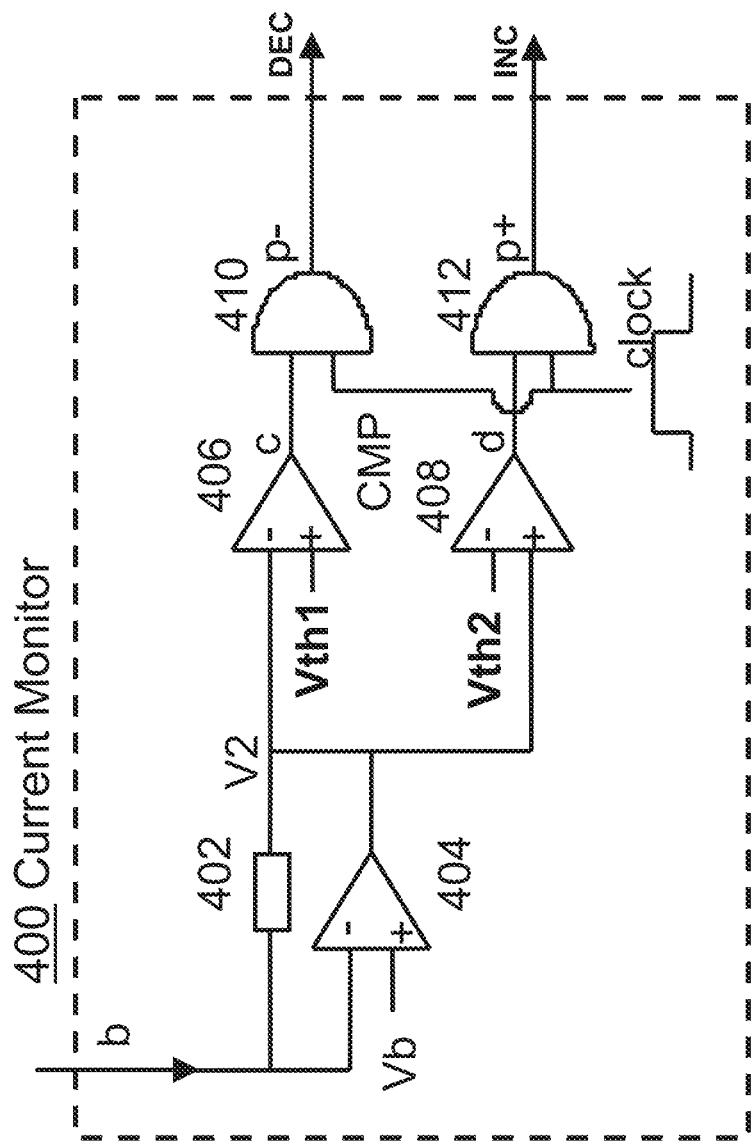
FIG. 6 illustrates a current monitor according to aspects of the present invention.

Current monitor 400 is shown in FIG. 6, wherein operational amplifier 404 and resistor 402 form a trans-impedance amplifier, which converts the input current to the output voltage $V_2$. $V_b$ is the positive input bias voltage, which sets a positive bias output voltage of $V_2$. The output voltage $V_2$ decreases with increasing sink current from current probe 200. Voltage comparators 406 and 408 have predefined threshold voltages $V_{th1}$ and $V_{th2}$ and also receive $V_2$ as input. AND gates 410 and 412 receive outputs c and d from voltage comparators 406 and 408 respectively. $V_{th1}$ is the corresponding threshold voltage of the upper limit of the avalanche current. When the avalanche current is increased, the trans-impedance amplifier output voltage $V_2$ becomes lower than $V_{th1}$, and the output of voltage comparator 406 becomes logic high. Consequently, AND gate 410 outputs the clock pulse p− to reduce the voltage V_supply in order to protect the zener diode 300 from damage. $V_{th2}$ is the corresponding threshold voltage of the lower limit of the avalanche current when the avalanche current is decreased, $V_2$ becomes higher than $V_{th2}$. The output of voltage comparator 408 becomes logic high and AND gate 412 outputs the clock pulse p+ to increase the voltage V_supply in order to keep zener diode 300 within the avalanche condition. When $V_2$ is between $V_{th1}$ and $V_{th2}$, there is no pulse from either AND gates 410 or 412, and thus V_supply stays unchanged. Vb is usually selected as the half value of the power supply voltage of 404, 406, 408. The operation of current monitor 400 is shown in Table 1 below:

TABLE 1

Figure 7:
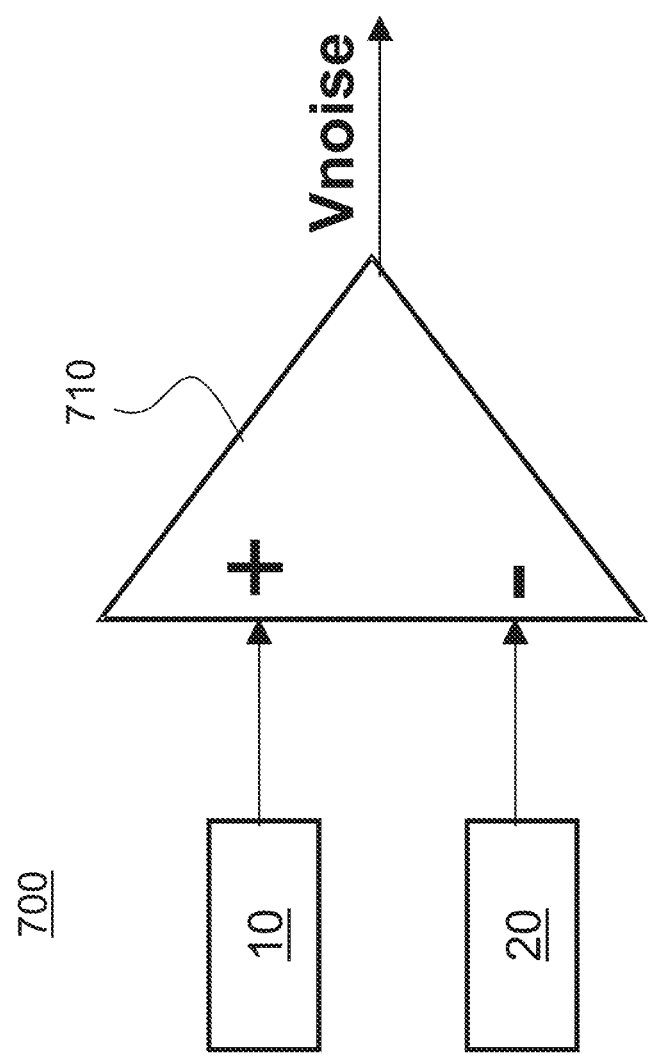
FIG. 7 illustrates a first embodiment of a stochastic noise amplification apparatus to increase the noise source according to aspects of the present invention.

$V_{th1} < V_{th2}$
Case 1: $V_1 < V_{th1}$ ➔ c = H ➔ p− ➔ decrease V_supply
Case 2: $V_1 > V_{th2}$ ➔ d = H ➔ p+ ➔ increase V_supply
Case 3: $V_{th1} < V_1 < V_{th2}$ ➔ c = L & d = L ➔ V_supply no change FIG. 7 illustrates a first embodiment of a stochastic noise amplification apparatus 700 to increase the noise source according to aspects of the present invention. Stochastic noise amplification apparatus 700 receives an input from two NGU's 10 and 20. The two inputs are provided to operational amplifier 710. NGU 10 may be input into the positive input of operational amplifier 710. NGU 20 may be input into the negative input of operational amplifier 710. The resulting noise signal through this single-stage differential amplification will be more non-deterministic, sporadic, and categorically not intermittent (i.e. random). The inventors have determined that the addition of two NGU signals increased the randomness of the signal by the square root two ($\sqrt{2}$=1.414) times.

Figure 8:
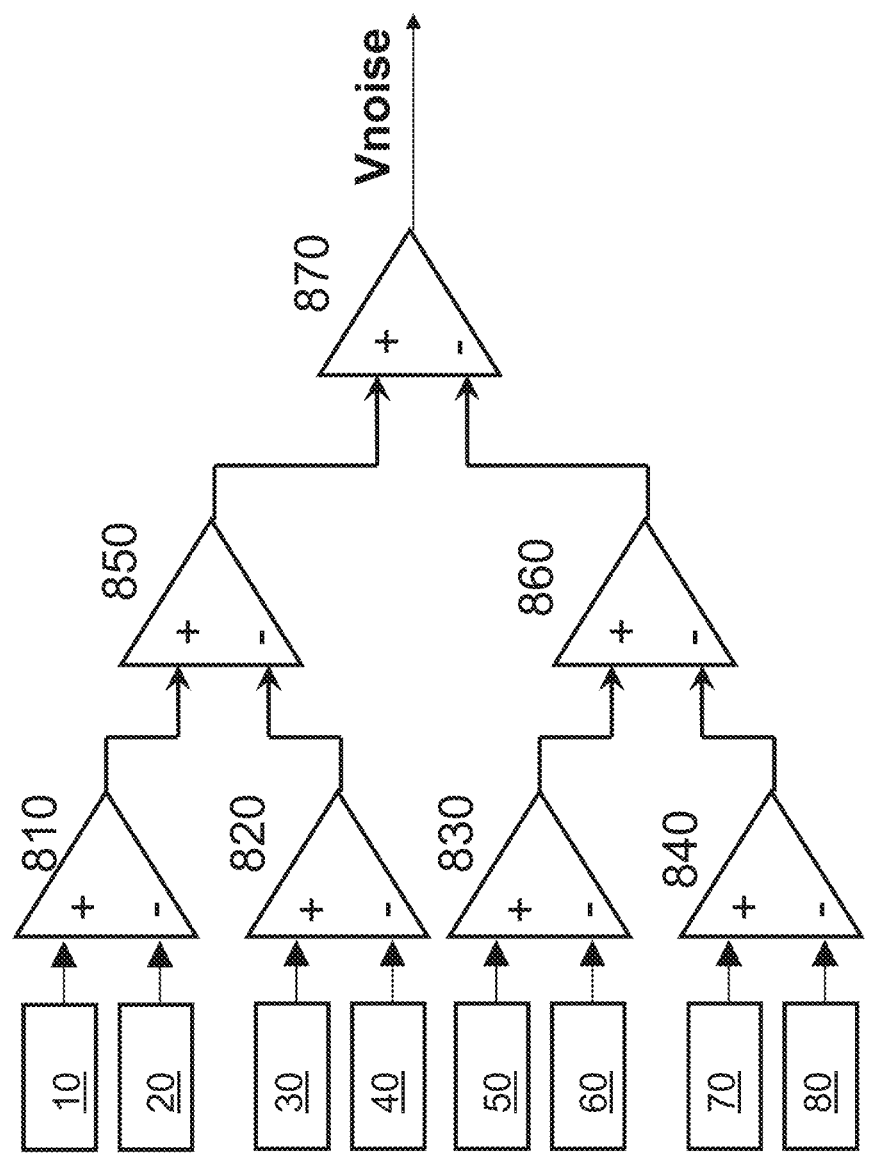
FIG. 8 illustrates a second embodiment of a stochastic noise amplification apparatus to increase the noise source according to aspects of the present invention.

FIG. 8 illustrates a three-stage differential amplification as an example of a second embodiment of a stochastic noise amplification apparatus 800 to further increase the noise source according to aspects of the present invention. The inputs to apparatus 800 are eight NGU inputs from NGU's 10, 20, 30, 40, 50, 60, 70 and 80. NGU 10 may be input into the positive input of operational amplifier 810. NGU 20 may be input into the negative input of operational amplifier 810. NGU 30 may be input into the positive input of operational amplifier 820. NGU 40 may be input into the negative input of operational amplifier 820. NGU 50 may be input into the positive input of operational amplifier 830. NGU 60 may be input into the negative input of operational amplifier 830. NGU 70 may be input into the positive input of operational amplifier 840. NGU 80 may be input into the negative input of operational amplifier 840.

The output of operational amplifier 810 may be input into the positive input of operational amplifier 850. The output of operational amplifier 820 may be input into the negative input of operational amplifier 850. The output of operational amplifier 830 may be input into the positive input of operational amplifier 860. The output of operational amplifier 840 may be input into the negative input of operational amplifier 860. The output of operational amplifier 850 may be input into the positive input of operational amplifier 870. The output of operational amplifier 860 may be input into the negative input of operational amplifier 870. Finally the output of amplifier 870 incorporates the noise signal from each of the NGU inputs. The resultant noise signal through this exemplary three-stage differential amplification is increased by a factor of 2.8 ($(\sqrt{2})^3=1.414^3$) from the noise signal through a single NGU, and the power of the noise signal is increased by a factor of 8 ($2^3$) from that through a single NGU. Furthermore, this embodiment can be generalized to include an N-stage differential amplification, where the resultant noise signal through an N-stage differential amplification is increased by a factor of $(\sqrt{2})^N=1.414^N$ compared with a single NGU, and its power is increased by a factor of $2^N$.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A noise generating apparatus comprising:
   a zener diode located on a primary surface of a silicon substrate, wherein the zener diode comprises a P-doped silicon layer on the primary surface of the silicon substrate, and an N-doped polysilicon feature extending up from the P-doped silicon layer, the N-doped polysilicon feature having an upper portion that is wider than a lower portion, the zener diode further comprising spacers covering opposite sides of the lower portion of the N-doped polysilicon feature;
   a voltage source located on the silicon substrate to provide a supply voltage;
   a current probe for receiving the supply voltage from the voltage source and providing a voltage to the zener diode, the current probe mirroring the current through the zener diode; and
   a current monitor located on the silicon substrate to monitor current through the zener diode and adjust the supply voltage provided by the voltage source to maintain the zener diode in an avalanche zone close to a breakdown condition, the current monitor operable to receive the mirrored current from the current probe, the current monitor comprising a trans-impedance amplifier to monitor the current from the current probe and provide an output voltage, wherein the current monitor provides a decrement signal to the voltage source when the output voltage is below a first zener threshold voltage, and an increment signal to the voltage source when the output voltage is above a second zener threshold voltage.

2. The apparatus of claim 1, wherein the P-doped silicon layer is heavily doped with a p-type dopant with a concentration greater than $10^{18}$ cm$^{-3}$, and the N-doped polysilicon feature is heavily doped with an n-type dopant with a concentration greater than $10^{18}$ cm$^{-3}$ such that the zener diode breaks down at 1.5 volts with a safe operating range from 1.4 volts to 1.6 volts.

3. The apparatus of claim 1, wherein the voltage source comprises a counter and a digital to analog converter, wherein the digital to analog converter provides an adjustable voltage to the non-inverting input of an operational amplifier, the operational amplifier providing the supply voltage.

4. The apparatus of claim 1, wherein the zener diode comprises a multi-finger structure comprising multiple N-doped polysilicon features extending up from the P-doped silicon layer, wherein the multiple N-doped polysilicon features are arranged adjacent one another in a straight line, the multi-finger structure further comprising silicide contacts located on the surface of P-doped silicon layer between adjacent N-doped polysilicon features and silicide contacts located on an upper surface of the N-doped polysilicon features.

5. The apparatus of claim 1, wherein the zener diode breaks down at 1.5 volts with a safe operating range from 1.4 volts to 1.6 volts.

6. The apparatus of claim 1, wherein a noise signal, received from a different noise generating apparatus, is provided to an amplifier in the voltage source via a resistor.

7. A noise generating apparatus comprising:
   two noise generating units each comprising:
      an adjustable voltage source on a silicon substrate to provide a supply voltage;
      a current probe comprising a first MOSFET and a second MOSFET for receiving the supply voltage from the adjustable voltage source, the first MOSFET and the second MOSFET of the current probe form a current mirror;
      a zener diode located on a primary surface of the silicon substrate, the zener diode comprises a P-doped silicon layer on the primary surface of the silicon substrate, and an N-doped polysilicon feature extending up from the P-doped silicon layer, the N-doped polysilicon feature having an upper portion that is wider than a lower portion, the zener diode further comprising spacers covering opposite sides of the lower portion of the N-doped polysilicon feature such that a width of the upper portion of the N-doped polysilicon feature is equal to a combined width of the lower portion of the N-doped polysilicon feature and a width of both spacers, and the zener diode receives the supply voltage from the first MOSFET of the current probe; and
      a current monitor located on the silicon substrate to monitor current through the zener diode and adjust the supply voltage provided by the adjustable voltage source to maintain the zener diode in an avalanche zone close to a breakdown condition, the current monitor comprising a trans-impedance amplifier to monitor the current received from the second MOSFET of the current probe, and provide an output voltage to a first operational amplifier and a second operational amplifier such that the first operational amplifier compares the output voltage of the trans-impedance amplifier to a first threshold voltage and the second operational amplifier compares the output voltage of the trans-impedance amplifier to a second threshold voltage,
   wherein the noise signal from one noise generating unit is provided to the non-inverting input of an operational amplifier and the noise signal from the other noise generating unit is provided to the inverting input of the operational amplifier such that a resulting noise signal output from the operational amplifier is increased by a factor of $\sqrt{2}$ from the noise signal of either of the two noise generating units alone.

8. The apparatus of claim 7, wherein the P-doped silicon layer is heavily doped with a p-type dopant with a concentration greater than $10^{18}$ cm$^{-3}$, and the N-doped polysilicon feature is heavily doped with an n-type dopant with a concentration greater than $10^{18}$ cm$^{-3}$, and wherein the lower portion of the N-doped polysilicon feature, the upper portion of the N-doped polysilicon feature, and the spacers have a common thickness.

9. The apparatus of claim 7, wherein the adjustable voltage source comprises a counter and a digital to analog converter, wherein the digital to analog converter provides an adjustable voltage to the non-inverting input of an operational amplifier via a resistor, a fixed voltage is also provide to the non-inverting input of the operational amplifier, and the operational amplifier provides the supply voltage to the first MOSFET and the second MOSFET of the current probe.

10. The apparatus of claim 7, wherein the zener diode breaks down at 1.5 volts with a safe operating range from 1.4 volts to 1.6 volts.

11. The apparatus of claim 7, wherein the adjustable voltage source comprises an operational amplifier, wherein the non-inverting input of the operational amplifier is coupled to the output of a digital to analog converter which receives the output from a counter which receives the output of both the first operational amplifier and the second operational amplifier of the current monitor via a first AND gate and a second AND gate.

12. The apparatus of claim 7, wherein the trans-impedance amplifier comprises a resistor and an operational amplifier, outputs of which are coupled to the inverting input of the first operational amplifier and the non-inverting input of the second operational amplifier, both of the current monitor.

13. The apparatus of claim 7, wherein the voltage at the input to the zener diode is provided to a first terminal of a capacitor, and a second terminal of the capacitor outputs a noise signal of the noise generating apparatus.

14. A noise generating apparatus comprising:
an adjustable voltage source on a silicon substrate to provide a supply voltage, the adjustable voltage source comprises a counter, a digital to analog converter, a first resistor, a second resistor, and a closed loop operational amplifier, the digital to analog converter receives an output from the counter and provides an adjustable voltage to the non-inverting input of the closed loop operational amplifier via the first resistor, the closed loop operational amplifier receives a fixed voltage at the non-inverting input via the second resistor;
a current probe comprising a first MOSFET and a second MOSFET for receiving the supply voltage from the adjustable voltage source, the first MOSFET and the second MOSFET of the current probe form a current mirror, the closed loop operational amplifier of the adjustable voltage source provides the supply voltage to the first MOSFET and second MOSFET of the current probe;
a zener diode located on a primary surface of the silicon substrate receives the supply voltage from the first MOSFET of the current probe, the zener diode comprises a P-doped silicon layer on the primary surface of the silicon substrate, and an N-doped polysilicon feature extending up from the P-doped silicon layer, the N-doped polysilicon feature having an upper portion that is wider than a lower portion, the zener diode further comprising spacers covering opposite sides of the lower portion of the N-doped polysilicon feature, the P-doped silicon layer is heavily doped with a p-type dopant with a concentration greater than $10^{18}$ cm$^{-3}$, and the N-doped polysilicon feature is heavily doped with an n-type dopant with a concentration greater than $10^{18}$ cm$^{-3}$, and the voltage at the input to the zener diode is provided to a first terminal of a capacitor, and the a second terminal of the capacitor outputs a noise signal of the noise generating apparatus; and
a current monitor located on the silicon substrate to monitor current through the zener diode and adjust the supply voltage provided by the adjustable voltage source to maintain the zener diode in an avalanche zone close to a breakdown condition, the current monitor comprising a first operational amplifier and a third resistor configured as a trans-impedance amplifier, current from the second MOSFET of the current probe is provided to the inverting input of the first operational amplifier and an input of the third resistor, a positive bias voltage is provided to the non-inverting input of the first operational amplifier, outputs of both the first operational amplifier and the third resistor are provided to both the inverting input of a second operational amplifier and the non-inverting input of a third operational amplifier such that the second operational amplifier compares the output voltage of the trans-impedance amplifier to a first threshold voltage provided to the non-inverting input of the first operational amplifier and the second operational amplifier compares the output voltage of the trans-impedance amplifier to a second threshold voltage provided to the inverting input of the second operational amplifier,
when the output of the trans-impedance amplifier is lower than the first threshold voltage the output of the first operational amplifier is logic high causing a first AND gate to output a clock pulse to a decrement input of the counter of the adjustable voltage source in order to lower the supply voltage, and
when the output of the trans-impedance amplifier is higher than the second threshold voltage the output of the second operational amplifier is logic high causing a second AND gate to output a clock pulse to a increment input of the counter of the adjustable voltage source in order to increase the supply voltage.

15. The apparatus of claim 14, wherein the zener diode breaks down at 1.5 volts with a safe operating range from 1.4 volts to 1.6 volts.

16. The apparatus of claim 14, wherein the closed loop operational amplifier of the adjustable voltage source comprises a voltage divider configured as a negative feedback loop, the voltage divider comprising two resistors of equal resistance.

17. The apparatus of claim 14, wherein the first resistor and the second resistor have the same resistance value.

18. The apparatus of claim 1, wherein the voltage at the input to the zener diode is provided to a first terminal of a capacitor, and a second terminal of the capacitor outputs a first noise signal of the noise generating apparatus, and wherein a second noise signal, received from a different noise generating apparatus, is provided to the non-inverting input of an operational amplifier in the voltage source.

* * * * *